(12) United States Patent
Ker et al.

(10) Patent No.: US 6,838,908 B2
(45) Date of Patent: Jan. 4, 2005

(54) MIXED-VOLTAGE I/O DESIGN WITH NOVEL FLOATING N-WELL AND GATE-TRACKING CIRCUITS

(75) Inventors: Ming-Dou Ker, Hsinchu (TW); Che-Hao Chuang, Hsinchu (TW); Kuo-Chung Lee, Hsinchu (TW); Hsin-Chin Jiang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 10 days.

(21) Appl. No.: 10/400,873

(22) Filed: Mar. 28, 2003

(65) Prior Publication Data
US 2004/0189345 A1 Sep. 30, 2004

(51) Int. Cl.[7] .................. H03K 19/0175; H03K 19/094
(52) U.S. Cl. .......................... 326/83; 327/108; 327/534
(58) Field of Search .......................... 326/83, 81, 58; 327/538, 534, 310, 108; 323/313; 324/765; 365/189.09

(56) References Cited

U.S. PATENT DOCUMENTS

| | | | |
|---|---|---|---|
| 5,557,231 A | * | 9/1996 | Yamaguchi et al. ........ 327/534 |
| 5,864,243 A | | 1/1999 | Chen et al. |
| 5,959,444 A | * | 9/1999 | Casper ........................ 323/313 |
| 6,014,053 A | * | 1/2000 | Womack ..................... 327/538 |
| 6,064,097 A | * | 5/2000 | Hiraga ........................ 257/369 |
| 6,510,088 B2 | * | 1/2003 | Chen et al. ............. 365/189.09 |
| 6,603,328 B2 | * | 8/2003 | Takahashi et al. ........... 324/765 |
| 6,657,835 B2 | * | 12/2003 | Ker et al. ..................... 361/56 |
| 6,680,838 B2 | * | 1/2004 | Chen et al. .................. 361/111 |
| 6,741,098 B2 | * | 5/2004 | Takahashi et al. ............ 326/81 |
| 6,747,501 B2 | * | 6/2004 | Ker et al. .................... 327/310 |

OTHER PUBLICATIONS

Marcel J. M. Pelgrom and E. Carel Dijkmans, "A 3/5 V Compatible I/O Buffer," IEEE Journal of Solid–State Circuits, vol. 30, No. 7, Jul. 1995, pp. 823–825.
M. Takahashi, T. Sakurai, K. Sawada, K. Nogami, M. Ichida, and K. Matsuda, "3.3V–5V Compatible I/O Circuit Without Thick Gate Oxide," Proc. of IEEE Custom Integrated Circuits Conference, 1992, pp. 23.3.1–23.3.4.
G. Singh and R. Salem, "High–Voltage Tolerant I/O Buffers With Low–Voltage CMOS Process," IEEE Journal of Solid–State Circuits, vol. 34, 1999, pp. 1512–1525.
Deng–Yuan Chen, "Design of a Mixed 3.3V and 5V PCI I/O Buffer," Proc. of ASIC, 1996, pp. 336–339.

* cited by examiner

*Primary Examiner*—Patrick Wamsley
(74) *Attorney, Agent, or Firm*—Finnegan, Henderson, Farabow, Garrett & Dunner, L.L.P.

(57) ABSTRACT

A mixed-voltage I/O buffer circuit that prevents leakages through a driver stage PMOS transistor is provided. The buffer circuit has a first part that prevents leakage through a parasitic diode of the transistor and a second part that prevents leakage through the transistor when the transistor is turned on by a signal on a bonding pad having a voltage level higher than a power supply voltage of the buffer circuit. The buffer circuit provides biases approximately equal to the high voltage signal to a gate and a substrate terminal of the PMOS transistor when the bonding pad has the high voltage signal thereon, and provides a bias approximately equal to the power supply voltage of the buffer circuit to the gate and substrate of the PMOS transistor when the bonding pad has a low voltage signal thereon.

37 Claims, 4 Drawing Sheets

MIXED-VOLTAGE I/O DESIGN WITH NOVEL FLOATING N-WELL AND GATE-TRACKING CIRCUITS

FIELD OF THE INVENTION

This invention relates to a buffer circuit used in a mixed-voltage I/O design and, more particularly, to a novel floating N-well circuit and a novel gate-tracking circuit.

BACKGROUND OF THE INVENTION

In a complete system such as a computer, there is generally more than one power supply voltage. Different integrated circuits (ICs), or different chips, in the system may use different supply voltages and a mixed-voltage input/output (I/O) buffer circuit is generally necessary between different chips of the system with different power supply voltages.

In a system including a first circuit on a first chip and a second circuit on a second chip with an I/O buffer circuit coupled therebetween, the buffer circuit may have two operation modes. For the purpose of description, it is assumed that a power supply of the first circuit has a lower voltage level than that of the second circuit and the I/O buffer circuit has the same power supply as that of the first circuit, e.g., the first circuit and the I/O buffer circuit may have a power supply of 1.8V or 3.3V and the second circuit may have a power supply of 3.3V or 5V, respectively. An output mode is then defined as when the buffer receives one or more signals from the first circuit and outputs one or more signals to the second circuit. An input mode is defined as when the buffer receives one or more signals from the second circuit and outputs one or more signals back to the first circuit. In the output mode, the buffer should not be affected by the second circuit, while in the input mode, the buffer should not be affected by the first circuit.

In the output mode when the buffer takes signals from the first circuit and generates certain signals to the second circuit, the buffer operates normally, however, problems may occur when the buffer circuit operates in the input mode. Two problems associated with an I/O buffer in a mixed-voltage system are explained with reference to FIG. 1.

FIG. 1 shows a conventional buffer circuit 100 used in a mixed-voltage system. Buffer circuit 100 on a first chip having a logic circuit 102 and a driver circuit 104 is coupled to a first circuit 106 on the first chip and, through a bonding pad 108, to a second circuit 110 on a second chip. Buffer circuit 100 has a power supply voltage $V_{DD}$ of 1.8V and second circuit 110 has a power supply voltage of 3.3V. Driver circuit 104 includes a PMOS transistor 112 and an NMOS transistor 114, both of which are driven by logic circuit 102. Drain terminals of both PMOS transistor 112 and NMOS transistor 114 are coupled together and further coupled to bonding pad 108. Both a source and a substrate terminal of PMOS transistor 112 are coupled to $V_{DD}$. There is also a parasitic diode 116 between the drain and substrate of PMOS transistor 112.

A first problem occurs in the input mode when second circuit 110 outputs a logic "1", e.g., 3.3V, to bonding pad 108. Since PMOS transistor 112 has a drain voltage of 3.3V and a substrate, or n-well, voltage of 1.8V, the drain-substrate p-n junction of PMOS transistor 112 is forward biased, thereby causing a substantial amount of current flowing through diode 116 from bonding pad 108 to $V_{DD}$.

Furthermore, when bonding pad 108 is at 3.3V, while the gate of PMOS transistor 112 is at either 1.8V or 0V, PMOS transistor 112 is turned on due to the positive bias of its drain terminal with respect to its gate terminal. Therefore, current flows through transistor 112 from bonding pad 108 to the $V_{DD}$ terminal. This means that even in a state when PMOS transistor 112 is supposed to be off, i.e., when the gate is biased at 1.8V, PMOS transistor 112 may still be on and conducting current from bonding pad 108 to the $V_{DD}$ terminal.

SUMMARY OF THE INVENTION

Accordingly, the present invention is directed to mixed-voltage I/O circuit designs that obviate one or more of the problems due to limitations and disadvantages of the related art.

In accordance with the present invention, there is provided a buffer circuit connectable to a power supply voltage that includes a node, a driver circuit coupled to the node and comprising at least a first PMOS transistor, the first PMOS transistor having a substrate, a drain, and a parasitic diode between the drain and the substrate, the driver circuit having an on state and an off state, a first part to provide a first bias to the substrate of the first PMOS transistor when a first signal having a voltage level higher than the power supply voltage appears at the node, and a second part to provide a second bias to the substrate of the first PMOS transistor when a second signal having a voltage level less than the power supply voltage appears at the node, wherein the second bias has a voltage level approximately equal to the power supply voltage when the driver circuit is in the off state.

Also in accordance with the present invention, there is provided a buffer circuit connectable to a power supply voltage that includes a node, a driver circuit comprising at least a first PMOS transistor, the first PMOS transistor having a gate, a source and a drain, one of the source and the drain of the first PMOS transistor being coupled to the node, a first part to provide a first bias to the gate of the first PMOS transistor when a first signal having a voltage level higher than the power supply voltage appears at the node, a second part to provide a second bias to the gate of the first PMOS transistor when a second signal having a voltage level no greater than the power supply voltage appears at the node, wherein the second part comprises an NMOS transistor and a second PMOS transistor coupled together to provide the second bias voltage to the gate of the first PMOS transistor, and a third PMOS transistor coupled to the second part to turn off the NMOS transistor and the second PMOS transistor when the first signal appears at the node.

Further in accordance with the present invention, there is provided a buffer circuit connectable to a power supply voltage that includes a node, a driver circuit coupled to the node comprising at least a first PMOS transistor, the first PMOS transistor having a gate and a substrate, the driver circuit having an on state and an off state, a first part coupled to the gate and the substrate of the first PMOS transistor to provide a first bias to the gate of the first PMOS transistor and a second bias to the substrate of the first PMOS transistor when a first signal having a voltage level higher than the power supply voltage appears at the node, and a second part coupled to the gate and the substrate of the first PMOS transistor to provide a third bias to the gate of the first PMOS transistor and a fourth bias to the substrate of the first PMOS transistor when a second signal having a voltage level no greater than the power supply voltage appears at the node, wherein a voltage level of the fourth bias is approximately equal to the power supply voltage when the driver circuit is in the off state.

Still in accordance with the present invention, there is provided a system that includes a first circuit on a first chip and a second circuit on a second chip, a buffer circuit on the first chip having an input mode and an output mode of operation and coupled between the first circuit and the second circuit, wherein the buffer circuit is connectable to a first power supply voltage and the second circuit is connectable to a second power supply voltage, and wherein the first power supply voltage is lower than the second power supply voltage, a node coupling the buffer circuit to the second circuit, and a control signal terminal for providing a first control signal to switch the buffer circuit into the output mode, in which the buffer circuit receives at least one signal from the first circuit and outputs at least one signal to the second circuit, and for providing a second control signal to switch the buffer circuit into the input mode, in which the buffer circuit receives at least one signal from the second circuit and outputs at least one signal to the first circuit, wherein the buffer circuit includes a driver circuit comprising at least a first PMOS transistor, the first PMOS transistor having a drain and a substrate, a first part coupled to the substrate of the first PMOS transistor to provide a first bias to the substrate of the first PMOS transistor when a first signal having a voltage level higher than the first power supply voltage appears at the node, wherein the first bias has a voltage level approximately equal to the voltage level of the first signal, and a second part coupled to the substrate of the first PMOS transistor to provide a second bias to the substrate of the first PMOS transistor when a second signal having a voltage level lower than the first power supply voltage appears at the node, wherein the second bias has a voltage level approximately equal to the first power supply voltage in the input mode.

Still further in accordance with the present invention, there is provided a system that includes a first circuit on a first chip and a second circuit on a second chip, a buffer circuit on the first chip having an input and an output mode of operation and coupled between the first circuit and the second circuit, wherein the buffer circuit is connectable to a first power supply voltage and the second circuit is connectable to a second power supply voltage, and wherein the first power supply voltage is lower than the second power supply voltage, a node coupling the buffer circuit to the second circuit, and a control signal terminal for providing a first control signal to switch the buffer circuit into the output mode, in which the buffer circuit receives at least one signal from the first circuit and outputs at least one signal to the second circuit, and for providing a second control signal to switch the buffer circuit into the input mode, in which the buffer circuit receives at least one signal from the second circuit and outputs at least one signal to the first circuit, wherein the buffer circuit comprises a driver circuit comprising at least a first PMOS transistor, the first PMOS transistor having a gate, a first part to provide a first bias to the gate of the first PMOS transistor when a first signal having a voltage level higher than the power supply voltage appears at the node, a second part to provide a second bias to the gate of the first PMOS transistor when a second signal having a voltage level no greater than the power supply voltage appears at the node, wherein the second bias has a voltage level approximately equal to the power supply voltage, and wherein the second part comprises an NMOS transistor and a second PMOS transistor coupled together to provide the second bias voltage to the gate of the first PMOS transistor, and a third PMOS transistor coupled to the second part, wherein the third PMOS transistor is turned on to turn off the NMOS transistor and the second PMOS transistor when the first signal appears at the node and turned on when the second signal appears at the node.

Yet still in accordance with the present invention, there is provided a system that includes a first circuit on a first chip and a second circuit on a second chip, a buffer circuit on the first chip having an input and an output mode of operation and coupled between the first circuit and the second circuit, wherein the buffer circuit is connectable to a first power supply voltage and the second circuit is connectable to a second power supply voltage, and wherein the first power supply voltage is lower than the second power supply voltage, a node coupling the buffer circuit to the second circuit, and a control signal terminal for providing a first control signal to switch the buffer circuit into the output mode, in which the buffer circuit receives at least one signal from the first circuit and outputs at least one signal to the second circuit, and for providing a second control signal to switch the buffer circuit into the input mode, in which the buffer circuit receives at least one signal from the second circuit and outputs at least one signal to the first circuit, wherein the buffer circuit comprises a driver circuit coupled to the node comprising at least a first PMOS transistor, the first PMOS transistor having a gate and a substrate, a first part of the buffer circuit coupled to the gate and the substrate of the first PMOS transistor to provide a first bias to the gate of the first PMOS transistor and a second bias to the substrate of the first PMOS transistor when a first signal having a voltage level higher than the first power supply voltage appears at the node, and a second part of the buffer circuit coupled to the gate and the substrate of the first PMOS transistor to provide a third bias to the gate of the first PMOS transistor and a fourth bias to the substrate of the first PMOS transistor when a second signal having a voltage level lower than the first power supply voltage appears at the node.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Consistent with the present invention, there is provided a circuit that comprises a floating well circuit to prevent a parasitic diode between a drain and a substrate terminal of a driver stage PMOS transistor from being turned on in an input mode, and a gate-tracking circuit to bias a gate of the driver stage PMOS transistor at a high voltage level when logic high signal appears on a bonding pad, in order to prevent the PMOS transistor from being turned on in the input mode.

Figure 1:
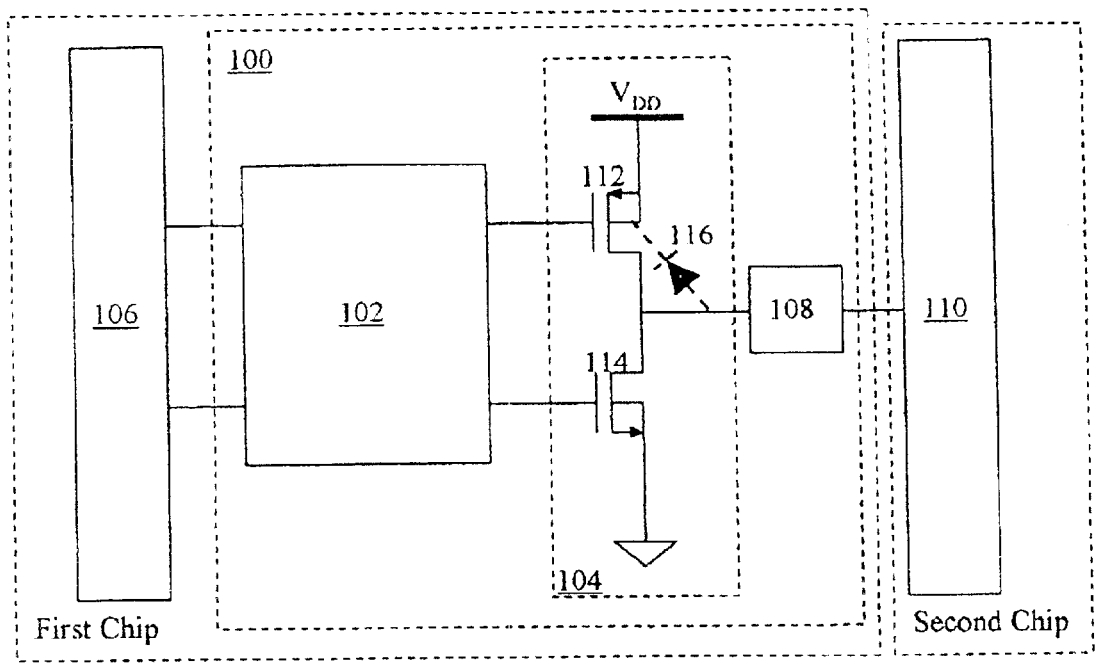
FIG. 1 shows a conventional I/O buffer circuit.
Figure 2:
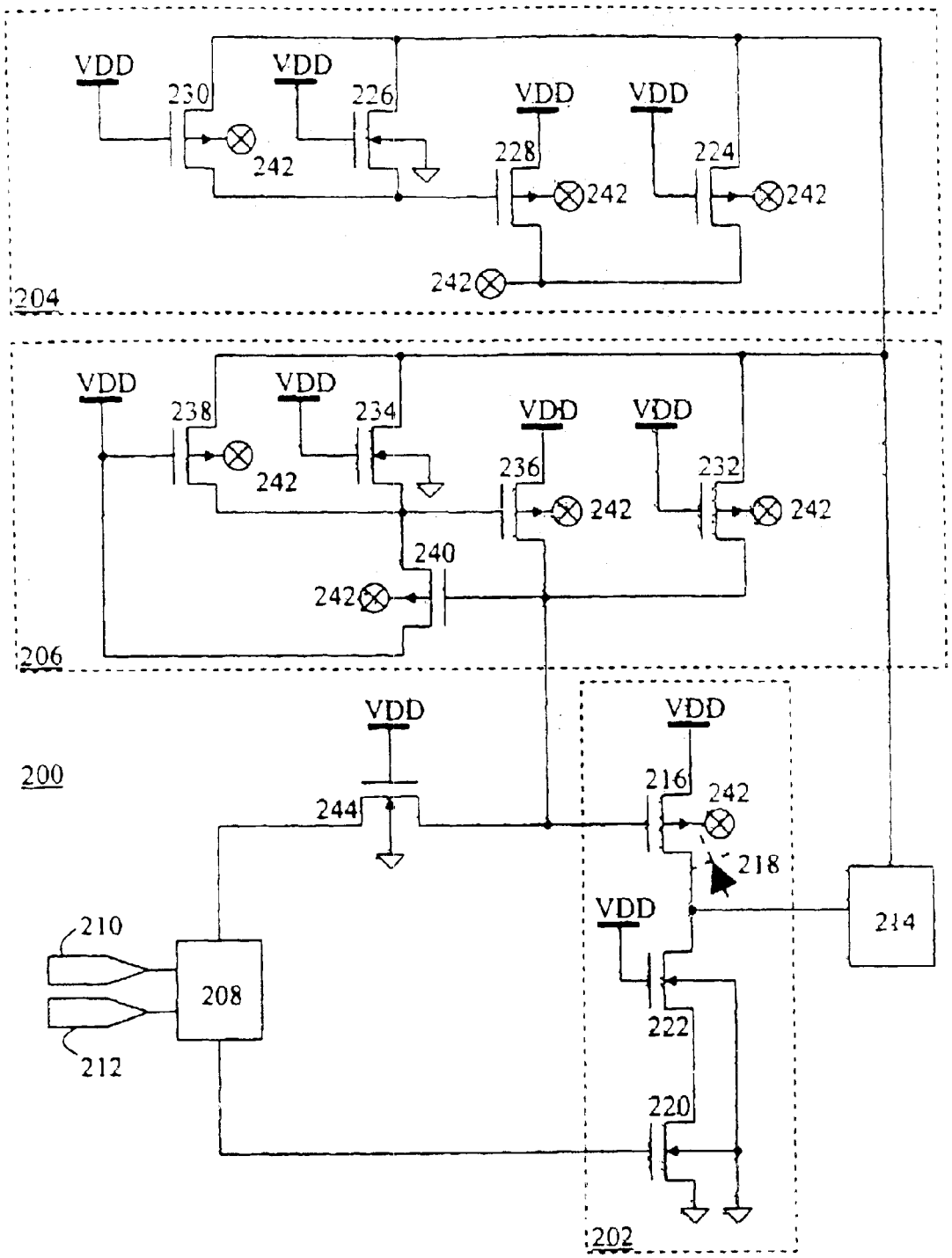
FIG. 2 shows an I/O buffer circuit including a floating well and a gate-tracking circuit consistent with the present invention.

An embodiment consistent with the present invention is shown in FIG. 2.

An I/O buffer circuit 200 having a driver circuit 202, a floating well circuit 204 and a gate-tracking circuit 206 is coupled between a first circuit on a first chip and a second circuit (not shown) on a second chip (not shown) of a mixed-voltage system. Signals are transported from the first circuit to the second circuit in the output mode and from the second circuit to the first circuit in the input mode. For convenience of explanation, without limitation, it is assumed that buffer circuit 200 and the first circuit are both connectable to a first power supply voltage of 1.8V, represented by $V_{DD}$, and the second circuit is connectable to a second power supply voltage of 3.3V. Alternatively, the first and second power supply voltages may also be 3.3V and 5V, respectively, or another pair of voltages encountered in integrated circuit applications.

Buffer circuit 200 is coupled to the first circuit through a pre-driver circuit 208, which receives signals from the first circuit at one or more input terminals. Such input terminals may include a control signal terminal 210 and a data input terminal 212, providing an output enable signal OEN and data to pre-driver circuit 208, respectively. The output enable signal OEN enables and disables the output mode. For example, a logic high signal of OEN may switch buffer circuit 200 into the input mode by shutting down a path for the input data and opening a path for a signal appearing at a node or a bonding pad 214 from the second circuit to get through buffer circuit 200, and a logic low signal of OEN may switch buffer circuit 200 into the output mode.

A signal applied to bonding pad 214 is called an input signal in the input mode and an output signal in the output mode, both of which may have two states, a logic high and a logic low. With a power scheme of 1.8V/3.3V, i.e., the first power supply voltage is 1.8V and the second power supply voltage is 3.3V, an input signal having a voltage level above 1.8V is considered logic high. With a power scheme of 3.3V/5V, an input signal having a voltage level above 3.3V is considered logic high. A logic high output signal has a voltage level approximately equal to or slightly less than the first power supply voltage. A logic low signal in both the input and output modes can have a voltage level anywhere from 0V to a certain positive value. For convenience of explanation, without limitation, it is assumed hereinafter that, a logic high input signal has a voltage level of 3.3V, a logic high output signal has a voltage level of 1.8V, and both the logic low input signal and logic low output signal have a voltage level of 0V.

Driver circuit 202 including a PMOS transistor 216 is coupled to bonding pad 214 at a drain terminal of PMOS transistor 216. PMOS transistor 216 also has a substrate, or n-well, a source, a gate, and a parasitic diode 218 between the drain and substrate as indicated by broken lines in FIG. 2. Floating well circuit 204 provides different biases to the substrate of PMOS transistor 216 and prevents parasitic diode 218 from being turned on, while gate-tracking circuit 206 adjusts a bias on the gate of PMOS transistor 216, thereby turning PMOS transistor 216 off in the input mode. Therefore, according to the present invention, diode 218 will be off whenever the buffer circuit is stabilized.

Driver circuit 202 also comprises two stacked NMOS transistors 220 and 222. While NMOS transistor 220 is driven by pre-driver circuit 208, NMOS transistor 222 provides protection for NMOS transistor 220 such that a high voltage appearing on bonding pad 214 would not damage a gate dielectric of NMOS transistor 220.

Driver circuit 202 is turned on in the output mode and turned off in the input mode. In the output mode, one of transistors 216 and 220 is turned on and driver circuit 202 outputs data to the second circuit. In the input mode, both transistors 216 and 220 are turned off and buffer circuit 200 receives one or more signals from the second circuit.

Both floating well circuit 204 and gate-tracking circuit 206 have two parts, responsive respectively to the conditions when the signal on bonding pad 214 is a logic high input signal and when the signal is other than a logic high input signal.

A first part of floating well circuit 204 comprises a single PMOS transistor 224 and a second part of floating well circuit 204 comprises an NMOS transistor 226 and a PMOS transistor 228. The first part responds to a logic high input signal on bonding pad 214, and the second part responds to a signal on bonding pad 214 other than a logic high input signal. Floating well circuit 204 also includes a PMOS transistor 230.

Similarly, gate-tracking circuit 206 has a first part comprising a single PMOS transistor 232 and a second part comprising an NMOS transistor 234 and a PMOS transistor 236. Gate-tracking circuit 206 also comprises a PMOS transistor 238 and may further comprise a PMOS transistor 240, as shown in FIG. 2.

Each of the PMOS and NMOS transistors included in buffer circuit 200 has a substrate, a source, a drain and a gate terminal. Referring to FIG. 2, the substrates of all of the PMOS transistors are coupled to a floating common node 242 and the substrates of all the NMOS transistors are grounded.

In floating well circuit 204, the sources of PMOS transistors 224 and 230 and NMOS transistor 226 are coupled to bonding pad 214. The source of PMOS transistor 228 and the gates of PMOS transistors 224 and 230 and NMOS transistor 226 are all biased at $V_{DD}$. The drain terminals of both NMOS transistor 226 and PMOS transistor 230 are coupled to the gate of PMOS transistor 228. The drain terminals of both PMOS transistors 224 and 228 are coupled together and further coupled to common node 242 to provide a substrate bias to PMOS transistor 216.

In gate-tracking circuit 206, the sources of PMOS transistors 232 and 238 and NMOS transistor 234 are coupled to bonding pad 214. The source of PMOS transistor 236 and the gates of PMOS transistors 232 and 238 and NMOS transistor 234 are all biased at $V_{DD}$. The drain terminals of both NMOS transistor 234 and PMOS transistor 238 are coupled to the gate of PMOS transistor 236. The drain terminals of both PMOS transistors 232 and 236 are coupled together to provide a gate bias to PMOS transistor 216. The gate of PMOS transistor 240 is coupled to the gate of PMOS transistor 216. The source of PMOS transistor 240 is coupled to $V_{DD}$ and its drain is coupled to the gate of PMOS transistor 236.

It is to be understood that a source and a drain of an MOS transistor are generally symmetrical to each other and therefore the source and drain of the transistors in the above circuit configuration are interchangeable.

Buffer circuit 200 may also comprise an additional NMOS transistor 244, which protects pre-driver circuit 208 and the first circuit from being affected or damaged by a high voltage signal coming from the second circuit.

The functions of each part of the circuit will be explained next with respect to different conditions and operation modes.

A. Input Mode, Logic High Input Signal (3.3V)

When bonding pad 214 is at a potential of 3.3V, the sources of PMOS transistors 224 and 232 are biased at 3.3V and since both their gates are biased at 1.8V, PMOS transistors 224 and 232 are turned on and their drain voltages are pushed up to approximately 3.3V. Therefore, both the gate and the substrate of PMOS transistor 216 are biased at approximately 3.3V.

As a result, PMOS transistor 216 and diode 218 remain off or are turned off when a logic high signal is applied to bonding pad 214 in the input mode, and there is no leakage current through PMOS transistor 216 and diode 218.

The logic high voltage of 3.3V on bonding pad 214 turns on PMOS transistors 230 and 238. Therefore, both PMOS transistors 228 and 236 are biased at approximately 3.3V on their gate terminals and are turned off. As a result, PMOS transistors 230 and 238 help to increase a switching speed and lower a power consumption of the circuit.

For an input signal having a voltage level lower than 3.3V but high enough to turn on PMOS transistors 224 and 232, the gate and substrate of PMOS transistor 216 will both be biased at approximately the voltage level of the input signal. Therefore, PMOS transistor 216 and parasitic diode 218 will be turned off.

B. Input Mode, Logic Low Input Signal (0V)

When a logic low input signal is applied to bonding pad 214 and therefore also to the sources of both PMOS transistors 224 and 232, both of PMOS transistors 224 and 232 will be turned off. However, since NMOS transistors 226 and 234 have a gate bias of 1.8V, they will both be turned on, thereby biasing PMOS transistors 228 and 236 at approximately 0V on the gate terminals. As PMOS transistors 228 and 236 are turned on, the substrate and gate of PMOS transistor 216 will both be biased at approximately 1.8V, which assures an off state for PMOS transistor 216 and parasitic diode 218.

Similarly, for an input signal having a positive voltage level but that is low enough to turn on NMOS transistors 226 and 234, the gate and substrate of PMOS transistor 216 will both be biased at approximately 1.8V and PMOS transistor 216 and diode 218 will be turned off.

C. Output Mode, Logic High Output Signal (1.8V)

In the output mode, the gate of PMOS transistor 216 will be driven by pre-driver circuit 208 through NMOS transistor 244, and PMOS transistor 216 will be turned on and off according to the signals provided to input terminals 210 and 212.

When the output signal on bonding pad 214 is logic high, i.e., 1.8V, the gate of PMOS transistor 216 is biased at ground level and should remain at ground level. However, a voltage of 1.8V at bonding pad 214 will turn off PMOS transistor 238 and pull up the voltage at the drain terminal of NMOS transistor 234 to 1.8V-$V_{TH234}$, where $V_{TH234}$ is the threshold voltage of NMOS transistor 234. As a result, PMOS transistor 236 is operating at a sub-threshold region and a leakage current flows through PMOS transistor 236 to slowly charge the gate of PMOS transistor 216. PMOS transistor 216 is partially turned-on. To prevent such a charging effect of PMOS transistor 236 on the gate of PMOS transistor 216, PMOS transistor 240 is turned on to provide a bias of approximately 1.8V to the gate of PMOS transistor 236 to completely turn off PMOS transistor 236.

D. Output Mode, Logic Low Output Signal (0V)

Similar to the case of the input mode with a logic low input signal, a 0V signal on bonding pad 214 will turn off both PMOS transistors 224 and 232 and turn on both NMOS transistors 226 and 234. Therefore, the gate terminals of PMOS transistors 228 and 236 are biased at approximately 0V, and the substrate and gate of PMOS transistor 216 will both be biased at approximately 1.8V.

E. Simulation Results

Figure 3:
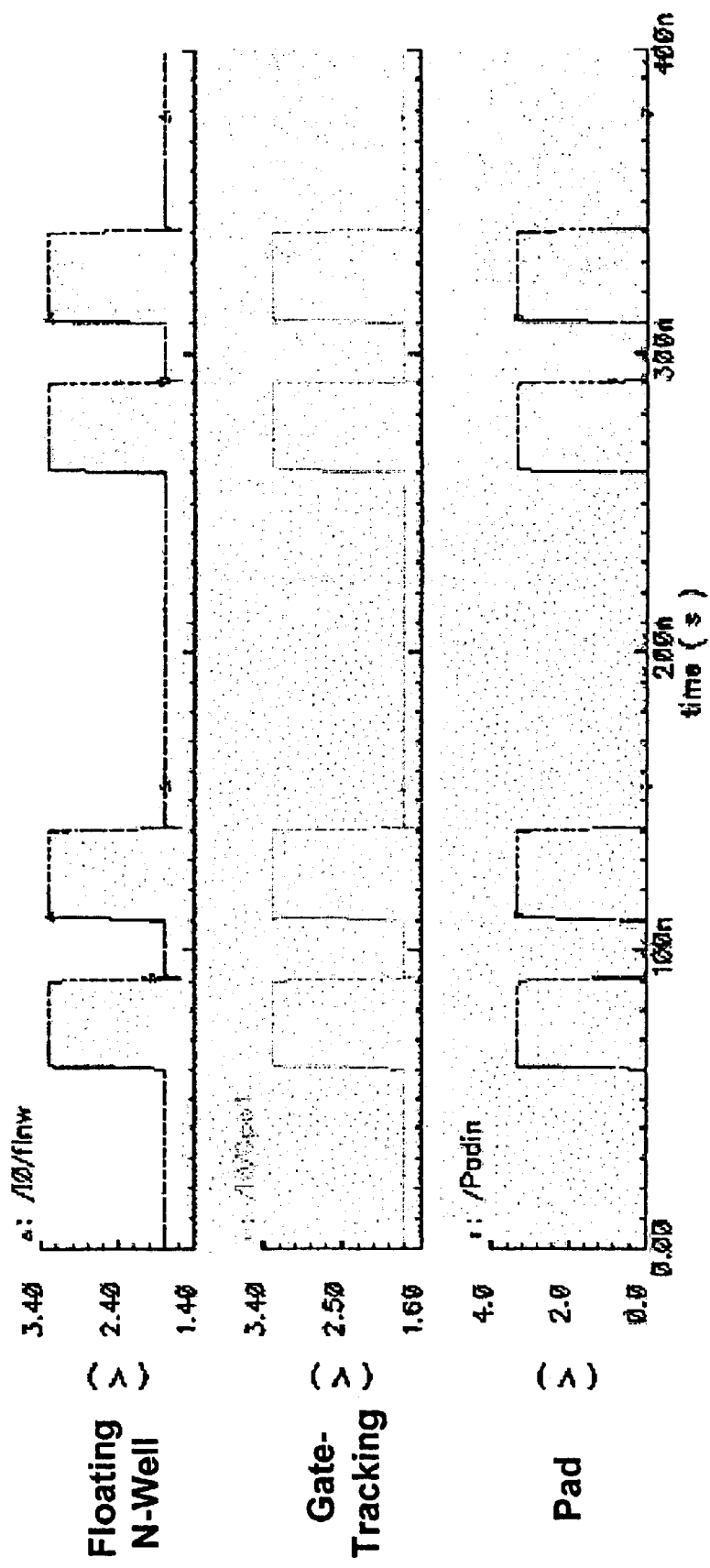
FIG. 3 shows simulation results of a floating well circuit and a gate-tracking circuit consistent with the present invention in an input mode.
Figure 4:
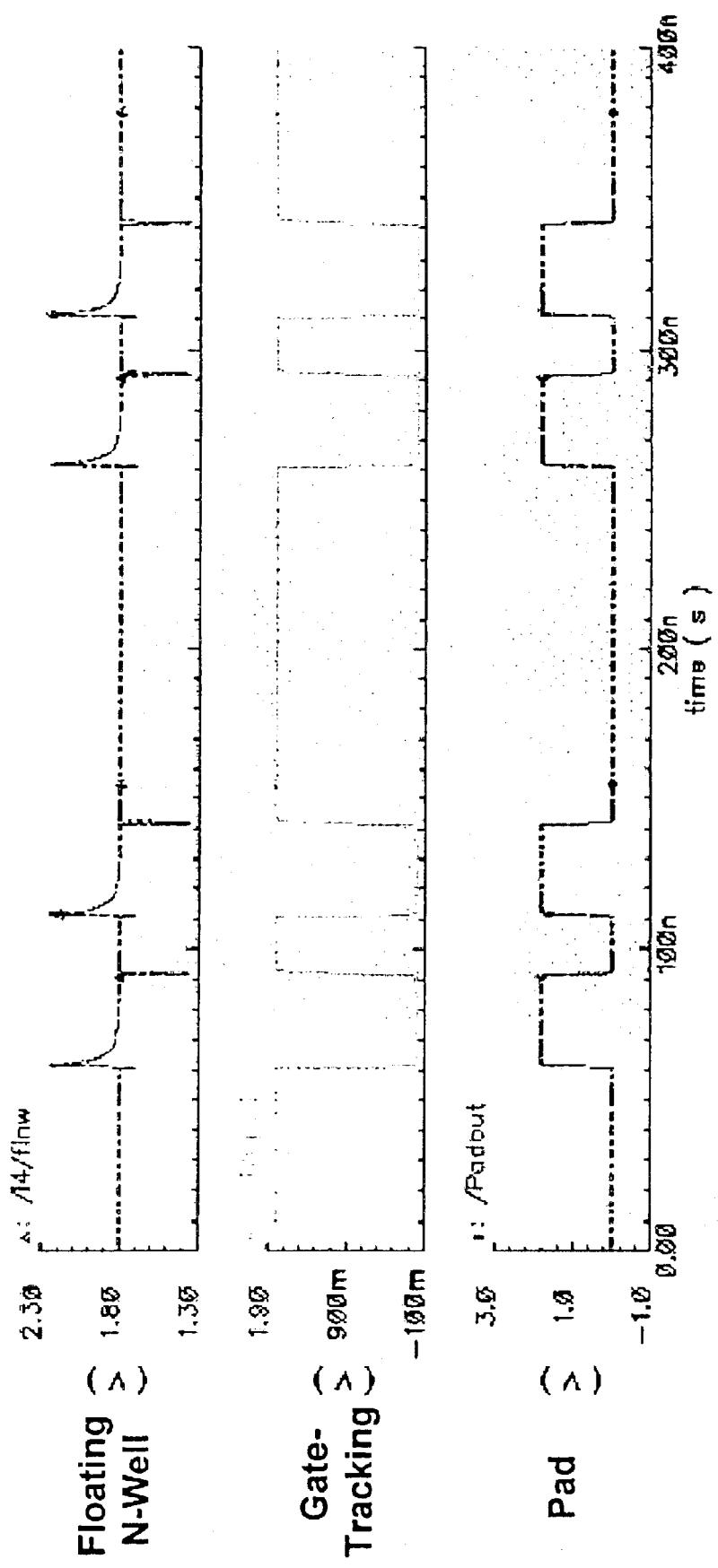
FIG. 4 shows simulation results of a floating well circuit and a gate-tracking circuit consistent with the present invention in an output mode.

FIGS. 3 and 4 show simulation results for operation of buffer circuit 200.

FIG. 3 shows simulation results of the gate bias and substrate bias of PMOS transistor 216 in the input mode with respect to the input signal on bonding pad 214. The first power supply voltage is assumed to be 1.8V. The input signal has a logic high value of 3.3V and logic low of 0V, with a rise time and fall time between the logic high and low states both being 1 ns and a pulse width being 30 ns. A loading capacitance of bonding pad 214 is assumed to be 10 pF. As shown in FIG. 3, when the input signal on bonding pad 214 is in a logic high state, i.e., 3.3V, both the n-well and gate of PMOS transistor 216 are biased at about 3.3V. Therefore, there is no current leakage through PMOS transistor 216 and parasitic diode 218 when the input signal is high. When the input signal is in a logic low state, i.e., 0V, both the gate and substrate of PMOS transistor 216 are biased at around 1.8V, and therefore PMOS transistor 216 and diode 218 are turned off.

FIG. 4 shows simulation results of the gate and substrate biases of PMOS transistor 216 in the output mode according to changes in the output signal on bonding pad 214. All parameters are the same as for FIG. 3, except that the output signal on bonding pad 214 has a logic high voltage value of 1.8V instead of 3.3V. As shown in FIG. 4, the substrate of PMOS transistor 216 is biased at about 1.8V whether the output is 1.8V or 0V. Spikes in the substrate bias occur during transitions between the two logic states of the output signal on bonding pad 214, but the floating well bias returns quickly to 1.8V. Gate bias of PMOS transistor 216 is 0V when the output signal is 1.8V, and 1.8V when the output signal is 0V.

Since buffer circuit 200 can be constructed using conventional MOS transistors, it can be fabricated together with the rest of an IC without requiring additional masks.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A buffer circuit connectable to a power supply voltage, comprising:
   a node;
   a driver circuit coupled to the node and comprising at least a first PMOS transistor, the first PMOS transistor having a substrate, a drain, and a parasitic diode between the drain and the substrate, the driver circuit having an on state and an off state;

a first part to provide a first bias to the substrate of the first PMOS transistor when a first signal having a voltage level higher than the power supply voltage appears at the node; and a second part to provide a second bias to the substrate of the first PMOS transistor when a second signal having a voltage level less than the power supply voltage appears at the node, wherein the second bias has a voltage level approximately equal to the power supply voltage when the driver circuit is in the off state.

2. The circuit of claim 1, wherein the second part comprises an NMOS transistor and a second PMOS transistor coupled to the node, both being turned on when the second signal appears at the node.

3. The circuit of claim 2, further comprising a third PMOS transistor coupled to the node, the NMOS transistor and the second PMOS transistor, wherein the third PMOS transistor is turned on to turn off the NMOS transistor and the second PMOS transistor when the first signal appears at the node, and wherein the third PMOS transistor is turned off when the second signal appears at the node.

4. The circuit of claim 1, wherein the power supply voltage is lower than the voltage level of the first signal.

5. The circuit of claim 1, wherein the voltage level of the second signal is approximately 0V.

6. The circuit of claim 1, wherein the parasitic diode of the first PMOS transistor is off when the buffer circuit is stabilized.

7. The circuit of claim 1, wherein the driver circuit further comprises two stacked NMOS transistors serially coupled to the first PMOS transistor, all of the first PMOS transistor and the two stacked NMOS transistors being off when the driver circuit is in the off state, and either the first PMOS transistor or both of the two stacked NMOS transistors being on when the driver circuit is in the on state.

8. The circuit of claim 1, wherein the first part comprises a second PMOS transistor having a gate, a source, a drain and a substrate, and wherein the gate of the second PMOS transistor is connectable to the power supply voltage, the source of the second PMOS transistor is coupled to the node, and both the drain and substrate of the second PMOS transistor are coupled to the substrate of the first PMOS transistor.

9. The circuit of claim 1, wherein the first bias has a voltage level approximately equal to the voltage level of the first signal.

10. The circuit of claim 1, wherein the second bias has a voltage level approximately equal to the power supply voltage when the driver circuit is in the on state.

11. The circuit of claim 1, wherein the buffer circuit comprises a plurality of PMOS transistors, each having a substrate, and wherein the substrate of each of the plurality of PMOS transistors is coupled to the substrate of the first PMOS transistor.

12. A buffer circuit connectable to a power supply voltage, comprising:

a node;

a driver circuit comprising at least a first PMOS transistor, the first PMOS transistor having a gate, a source and a drain, one of the source and the drain of the first PMOS transistor being coupled to the node;

a first part to provide a first bias to the gate of the first PMOS transistor when a first signal having a voltage level higher than the power supply voltage appears at the node;

a second part to provide a second bias to the gate of the first PMOS transistor when a second signal having a voltage level no greater than the power supply voltage appears at the node, wherein the second part comprises an NMOS transistor and a second PMOS transistor coupled together to provide the second bias voltage to the gate of the first PMOS transistor; and a third PMOS transistor coupled to the second part to turn off the NMOS transistor and the second PMOS transistor when the first signal appears at the node.

13. The circuit of claim 12, wherein the power supply voltage is lower than the voltage level of the first signal.

14. The circuit of claim 12, wherein the voltage level of the second signal is approximately 0V.

15. The circuit of claim 12, wherein the first part comprises a fourth PMOS transistor coupled to the gate of the first PMOS transistor.

16. The circuit of claim 12, wherein the first bias has a voltage level approximately equal to the voltage level of the first signal.

17. The circuit of claim 12, wherein the second bias has a voltage level approximately equal to the power supply voltage.

18. The circuit of claim 12, further comprising a fourth PMOS transistor coupled to the second PMOS transistor to turn off the second PMOS transistor to prevent a leakage through the second PMOS transistor when the first PMOS transistor is turned on.

19. A buffer circuit connectable to a power supply voltage, comprising:

a node;

a driver circuit coupled to the node comprising at least a first PMOS transistor, the first PMOS transistor having a gate and a substrate, the driver circuit having an on state and an off state;

a first part coupled to the gate and the substrate of the first PMOS transistor to provide a first bias to the gate of the first PMOS transistor and a second bias to the substrate of the first PMOS transistor when a first signal having a voltage level higher than the power supply voltage appears at the node; and a second part coupled to the gate and the substrate of the first PMOS transistor to provide a third bias to the gate of the first PMOS transistor and a fourth bias to the substrate of the first PMOS transistor when a second signal having a voltage level no greater than the power supply voltage appears at the node, wherein a voltage level of the fourth bias is approximately equal to the power supply voltage when the driver circuit is in the off state.

20. The circuit of claim 19, wherein the power supply voltage is lower than the voltage level of the first signal, wherein the voltage level of the second signal is approximately 0V.

21. The circuit of claim 19, wherein a voltage level of the first bias is approximately equal to the voltage level of the first signal.

22. The circuit of claim 19, wherein a voltage level of the second bias is approximately equal to the voltage level of the first signal.

23. The circuit of claim 19, wherein a voltage level of the third bias is approximately equal to the power supply voltage.

24. The circuit of claim 19, wherein the voltage level of the fourth bias is approximately equal to the power supply voltage when the driver circuit is in the on state.

25. A system, comprising:
a first circuit on a first chip and a second circuit on a second chip;
a buffer circuit on the first chip having an input mode and an output mode of operation and coupled between the first circuit and the second circuit, wherein the buffer circuit is connectable to a first power supply voltage and the second circuit is connectable to a second power supply voltage, and wherein the first power supply voltage is lower than the second power supply voltage;
a node coupling the buffer circuit to the second circuit; and
a control signal terminal for providing a first control signal to switch the buffer circuit into the output mode, in which the buffer circuit receives at least one signal from the first circuit and outputs at least one signal to the second circuit, and for providing a second control signal to switch the buffer circuit into the input mode, in which the buffer circuit receives at least one signal from the second circuit and outputs at least one signal to the first circuit,
wherein the buffer circuit comprises
a driver circuit comprising at least a first PMOS transistor, the first PMOS transistor having a drain and a substrate,
a first part coupled to the substrate of the first PMOS transistor to provide a first bias to the substrate of the first PMOS transistor when a first signal having a voltage level higher than the first power supply voltage appears at the node, wherein the first bias has a voltage level approximately equal to the voltage level of the first signal, and
a second part coupled to the substrate of the first PMOS transistor to provide a second bias to the substrate of the first PMOS transistor when a second signal having a voltage level lower than the first power supply voltage appears at the node, wherein the second bias has a voltage level approximately equal to the first power supply voltage in the input mode.

26. The circuit of claim 25, wherein the second part of the buffer circuit comprises an NMOS transistor and a second PMOS transistor coupled to the node, both being turned on when the second signal appears at the node, wherein each of the NMOS transistor and the second PMOS transistor has a substrate, a source, a drain and a gate, and wherein the gate of the NMOS transistor and one of the source and the drain of the second PMOS transistor are connectable to the first power supply voltage, one of the source and the drain of the NMOS transistor is coupled to the gate of the second PMOS transistor, the other of the source and the drain of the NMOS transistor is coupled to the node, the substrate of the NMOS transistor is grounded, and the substrate and the other of the source and the drain of the second PMOS transistor are coupled to the substrate of the first PMOS transistor.

27. The circuit of claim 26, wherein the buffer circuit further comprises a third PMOS transistor coupled to the node, the NMOS transistor, and the second PMOS transistor, the third PMOS transistor having a gate connectable to the first power supply voltage, a source coupled to the node, a drain coupled to the gate of the second PMOS transistor, and a substrate coupled to the substrate of the first PMOS transistor, wherein the third PMOS transistor is turned on to turn off the NMOS transistor and the second PMOS transistor when the first signal appears at the node, and wherein the third PMOS transistor is turned off when the second signal appears at the node.

28. The circuit of claim 25, wherein the first power supply voltage is lower than the second power supply voltage.

29. The circuit of claim 25, wherein the driver circuit is turned on in the output mode and turned off in the input mode.

30. The circuit of claim 25, wherein the first part of the buffer circuit comprises a second PMOS transistor having a gate, a source, a drain and a substrate, and wherein the gate of the second PMOS transistor is connectable to the first power supply voltage, one of the source and the drain of the second PMOS transistor is coupled to the node, and the other of the source and the drain and the substrate of the second PMOS transistor are coupled to the substrate of the first PMOS transistor.

31. A system, comprising:
a first circuit on a first chip and a second circuit on a second chip;
a buffer circuit on the first chip having an input and an output mode of operation and coupled between the first circuit and the second circuit, wherein the buffer circuit is connectable to a first power supply voltage and the second circuit is connectable to a second power supply voltage, and wherein the first power supply voltage is lower than the second power supply voltage;
a node coupling the buffer circuit to the second circuit; and
a control signal terminal for providing a first control signal to switch the buffer circuit into the output mode, in which the buffer circuit receives at least one signal from the first circuit and outputs at least one signal to the second circuit, and for providing a second control signal to switch the buffer circuit into the input mode, in which the buffer circuit receives at least one signal from the second circuit and outputs at least one signal to the first circuit,
wherein the buffer circuit comprises
a driver circuit comprising at least a first PMOS transistor, the first PMOS transistor having a gate,
a first part to provide a first bias to the gate of the first PMOS transistor when a first signal having a voltage level higher than the power supply voltage appears at the node,
a second part to provide a second bias to the gate of the first PMOS transistor when a second signal having a voltage level no greater than the power supply voltage appears at the node, wherein the second bias has a voltage level approximately equal to the power supply voltage, and wherein the second part comprises an NMOS transistor and a second PMOS transistor coupled together to provide the second bias voltage to the gate of the first PMOS transistor, and
a third PMOS transistor coupled to the second part, wherein the third PMOS transistor is turned on to turn off the NMOS transistor and the second PMOS transistor when the first signal appears at the node and turned on when the second signal appears at the node.

32. The circuit of claim 31, wherein the first part of the buffer circuit comprises a fourth PMOS transistor coupled to the gate of the first PMOS transistor, and wherein the fourth PMOS transistor is turned on when the first signal appears at the node.

33. The circuit of claim 31, further comprising a fourth PMOS transistor coupled to the second PMOS transistor to turn off the second PMOS transistor when the buffer circuit outputs a logic high signal to the second circuit in the output mode to prevent a leakage through the second PMOS transistor.

34. A system, comprising:

a first circuit on a first chip and a second circuit on a second chip;

a buffer circuit on the first chip having an input and an output mode of operation and coupled between the first circuit and the second circuit, wherein the buffer circuit is connectable to a first power supply voltage and the second circuit is connectable to a second power supply voltage, and wherein the first power supply voltage is lower than the second power supply voltage;

a node coupling the buffer circuit to the second circuit; and a control signal terminal for providing a first control signal to switch the buffer circuit into the output mode, in which the buffer circuit receives at least one signal from the first circuit and outputs at least one signal to the second circuit, and for providing a second control signal to switch the buffer circuit into the input mode, in which the buffer circuit receives at least one signal from the second circuit and outputs at least one signal to the first circuit, wherein the buffer circuit comprises a driver circuit coupled to the node comprising at least a first PMOS transistor, the first PMOS transistor having a gate and a substrate, a first part of the buffer circuit coupled to the gate and the substrate of the first PMOS transistor to provide a first bias to the gate of the first PMOS transistor and a second bias to the substrate of the first PMOS transistor when a first signal having a voltage level higher than the first power supply voltage appears at the node, and a second part of the buffer circuit coupled to the gate and the substrate of the first PMOS transistor to provide a third bias to the gate of the first PMOS transistor and a fourth bias to the substrate of the first PMOS transistor when a second signal having a voltage level lower than the first power supply voltage appears at the node.

35. The circuit of claim 34, wherein the voltage level of the first signal is approximately equal to the second power supply voltage and the voltage level of the second signal is approximately 0V.

36. The circuit of claim 34, wherein a voltage level of the first bias and a voltage level of the second bias are approximately equal to the voltage level of the first signal and a voltage level of the third bias and a voltage level of the fourth bias are approximately equal to the first power supply voltage.

37. The circuit of claim 34, wherein the first circuit is connectable to the first power supply voltage.

* * * * *